US 9,406,859 B2

(12) United States Patent
Sebald et al.

(10) Patent No.: US 9,406,859 B2
(45) Date of Patent: Aug. 2, 2016

(54) METHOD AND ARRANGEMENT FOR CONVERTING HEAT TO ELECTRICAL ENERGY

(71) Applicant: Astrium GmbH, Taufkirchen (DE)

(72) Inventors: Johannes Sebald, Ritterhude (DE); Hendra Kesuma, Bremen (DE)

(73) Assignee: Astrium GmbH, Taufkirchen (DE)

( * ) Notice: Subject to any disclaimer, the term of this patent is extended or adjusted under 35 U.S.C. 154(b) by 255 days.

(21) Appl. No.: 14/084,889

(22) Filed: Nov. 20, 2013

(65) Prior Publication Data

US 2014/0137915 A1 May 22, 2014

(30) Foreign Application Priority Data

Nov. 20, 2012 (DE) .......................... 10 2012 022 863

(51) Int. Cl.
*H01L 35/32* (2006.01)
*H01L 35/30* (2006.01)

(52) U.S. Cl.
CPC ................ *H01L 35/32* (2013.01); *H01L 35/30* (2013.01)

(58) Field of Classification Search
CPC .............................. H01L 35/32; H01L 35/30
USPC ........................................................ 136/205
See application file for complete search history.

(56) References Cited

U.S. PATENT DOCUMENTS

| 3,304,206 A * | 2/1967 | Burdick .................. G21D 7/04 136/211 |
| 3,510,363 A | 5/1970 | Winkler et al. |
| 3,666,566 A | 5/1972 | Paine et al. |
| 5,793,119 A * | 8/1998 | Zinke ...................... F21C 15/00 126/110 E |
| 2006/0021648 A1 | 2/2006 | Parise |
| 2009/0260667 A1* | 10/2009 | Chen ....................... H01L 35/00 136/201 |
| 2013/0180563 A1* | 7/2013 | Makansi ................. H01L 35/32 136/206 |

FOREIGN PATENT DOCUMENTS

DE    102008031266    1/2010

OTHER PUBLICATIONS

G. Jeffrey Snyder, "Small Thermoelectric Generators", The Electrochemical Society *Interface*, Fall 2008, pp. 54 to 56, http://www.electrochem.org/dl/interface/fal/fal08/fal08_p54-56.pdf.

* cited by examiner

*Primary Examiner* — Allison Bourke
(74) *Attorney, Agent, or Firm* — W. F. Fasse

(57) ABSTRACT

For directly converting heat to electrical energy, for example in a spacecraft operating in space, at least one thermoelectric generator module is arranged in an evacuated chamber so as to receive thermal radiation from a heat source through the interior vacuum within the interior of the chamber. The thermoelectric generator module converts a portion of the received heat to electrical energy and rejects a portion of the heat by thermal conduction to a thermally conducting cooling body such as the chamber wall or directly by thermal radiation to the surrounding vacuum of space.

17 Claims, 1 Drawing Sheet

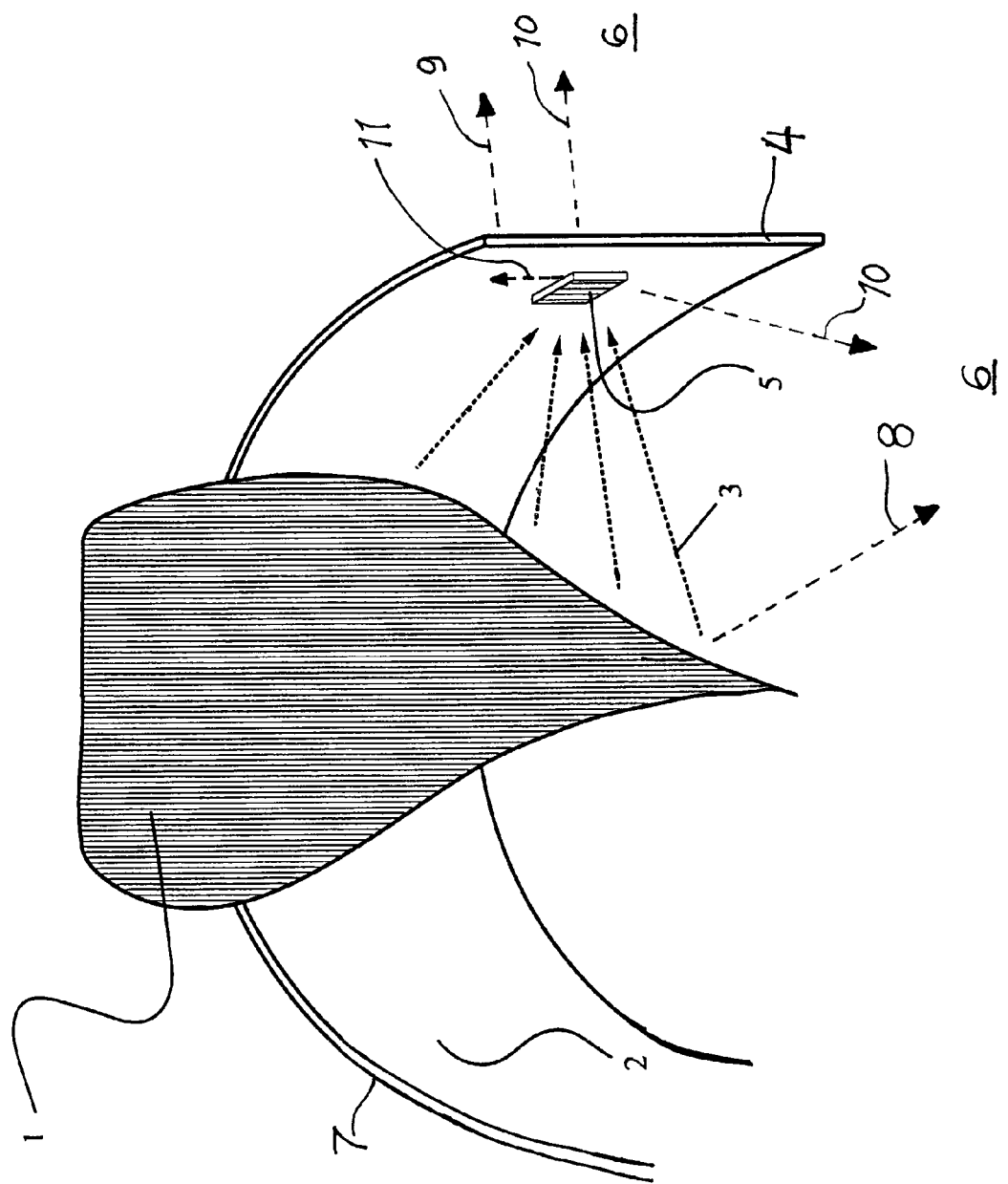

METHOD AND ARRANGEMENT FOR CONVERTING HEAT TO ELECTRICAL ENERGY

PRIORITY CLAIM

This application is based on and claims the priority under 35 USC 119 of German Patent Application 10 2012 022 863.5, filed on Nov. 20, 2012, the entire disclosure of which is incorporated herein by reference.

FIELD OF THE INVENTION

The invention relates to a method for directly converting heat into electrical energy or power using at least one thermoelectric generator module, wherein heat energy of a heat source is collected or received by a thermoelectric generator module and is then further transferred to a cooling body. The invention further relates to an apparatus or arrangement for carrying out such a method.

BACKGROUND INFORMATION

It is generally known that heat or particularly a temperature difference can be converted directly into electrical energy by making use of the so-called "Seebeck effect" or the "thermoelectric effect". Accordingly, devices or apparatus arrangements for directly converting heat into electrical energy have been developed to make use of such a known effect, for example in a so-called thermoelectric generator (TEG). However, the degree of efficiency of such devices is typically on the order of only about 5% in terms of the conversion of the available heat energy to the output electrical energy. Newer developments in this regard are described in the article "Small Thermoelectric Generators" by G. Jeffrey Snyder published in 2008 and available on the internet at the Internet address http://www.electrochem.org/dl/interface/fal/fal08/fal08_p54-56.pdf. Among other installations and uses, thermoelectric generators or converters are already used in isotope batteries such as Radio Isotope Thermoelectric Generators (RTG). These are advantageous in such applications because they convert heat energy directly into electrical energy without moving parts and thus without friction and without wear. Through the use of semiconductor materials, the conversion efficiency can be increased to the range from 3 to 8%, but even with the most up-to-date new materials the energy conversion efficiency still lies significantly below the Carnot Efficiency. Presently efforts are being made to use such thermoelectric generators for the recapture and conversion of waste heat, for example in motor vehicles, combined heating and power plants or cogeneration plants, waste water treatment plants and trash incineration plants.

In conventionally known applications, thermoelectric generators are often arranged in direct thermal conducting contact with the heat source. However, such an arrangement of the thermoelectric generator in direct contact with the heat source to collect or take in the heat energy can lead to problems. For example, the high operating temperatures of some heat sources, which can be up to 3400° C. for example, are too high to be directly applied to the thermoelectric generator, because typical conventionally available thermoelectric generators today can handle a maximum temperature of approximately 450° C.

U.S. Pat. No. 3,510,363 discloses a method of the above-mentioned general type, in which a thermoelectric generator can also be utilized in a satellite operating in space. Namely, as disclosed in this patent, the thermoelectric generator is arranged in the interior of a closed capsule that is filled with an inert gas, and in which a suitable heat source is located. In this known use, the thermoelectric generator is particularly a Radioisotope Thermoelectric Generator (RTG), which makes use of the heat arising from the radioactive decay of a radioactive material, to carry out its function of converting the heat energy to electrical energy. In that regard, thermal conduction as well as thermal radiation form respective portions of the overall heat transport process.

Furthermore, another arrangement with a Radioisotope Thermoelectric Generator is already known from U.S. Pat. No. 3,666,566, in which the heat transmission is achieved through a heat transfer medium and thermal conduction or latent heat phase transitions. Another similar arrangement is known from the US Patent Application Publication US 2006/0,021,648. Finally, the German Patent Application Laying-Open Document DE 10 2008 031 266 A1 discloses an arrangement in which a first surface of a generator is to achieve the most immediate delay-free adaptation of the generator surface temperature to the surrounding environment temperature, while a second one of the generator surfaces is provided with means that are intended to achieve the most delayed possible adaptation of the generator surface temperature to the surrounding environmental temperature. Thereby it is intended to achieve a transient operation of such a thermoelectric generator.

SUMMARY OF THE INVENTION

In view of the above, it is a first object of the invention to provide and further develop a method of the abovementioned general type so that such a method can also be carried out under vacuum conditions in space (e.g. interplanetary or extraterrestrial space). It is a second object of the invention to provide and further develop an apparatus or arrangement for carrying out such a method. A further aim or object of the invention is to specially adapt such a method and such an arrangement for use on a spacecraft operating in space. The invention further aims to avoid or overcome the disadvantages of the prior art, and to achieve additional advantages, as apparent from the present specification. The attainment of these objects is, however, not a required limitation of the claimed invention.

The above first object has been achieved according to the invention in an embodiment of such a method in that heat is emitted as thermal radiation from a heat source into an interior vacuum within a chamber, and the thermal radiation is transmitted through the interior vacuum by radiation coupling to at least one thermoelectric generator module, in which a portion of the heat is converted to electricity and from which another portion of the heat is removed or rejected by conduction to a cooling body and/or by radiation directly into the surrounding vacuum of space, for example outside of a spacecraft operating in space.

The abovementioned second object has been achieved according to the invention in an embodiment of an arrangement in which at least one thermoelectric generator module, and optionally a plurality of such thermoelectric generator modules, is/are arranged in proximity to a heat source in the interior of an evacuated chamber (i.e. a chamber of which the interior is "filled" with vacuum), wherein a wall of the chamber bounding the interior thereof is at least partially embodied or constructed as a thermally conductive cooling body, and wherein the thermoelectric generator module is connected for heat transfer with the heat source by radiative coupling through the interior vacuum within the interior of the chamber.

In the use of such a thermoelectric generator module in the interior of an evacuated chamber of which the bounding wall is at least partially embodied as a cooling body, several advantages are achieved, for example as follows. First, the thermoelectric generator module is flexibly locatable in the vicinity and surroundings of the heat source, if necessary on a thermally conducting body, for example, in this case on a bounding wall of the chamber, which is at least partially embodied as a cooling body. Secondly, the inventive arrangement does not require a direct mechanical contact or thermally conducting connection between the heat source and the thermoelectric generator, but rather the inventive arrangement of a thermoelectric generator module uses radiative coupling that is also effective in vacuum, so that a direct mechanical connection and/or thermally conducting connection between the heat source and the thermoelectric generator can be expressly avoided. Furthermore, the thermoelectric generator module in the inventive arrangement can reject or give-off the waste heat portion either to the thermally conducting cooling body (e.g. at least the portion of the chamber wall that is embodied as a thermally conducting cooling body), or it can radiate away the heat into the surrounding vacuum of space, whereby an additional cooling of the entire arrangement is not necessary and can thus be expressly avoided.

BRIEF DESCRIPTION OF THE DRAWING

In order that the invention may be clearly understood, it will now be explained in further detail in connection with an example embodiment thereof, with reference to the single drawing FIGURE, which schematically represents an arrangement of a thermoelectric generator module on a bounding wall of an evacuated chamber in which a heat source is arranged.

DETAILED DESCRIPTION OF A PREFERRED EXAMPLE EMBODIMENT OF THE INVENTION

The single drawing FIGURE schematically represents an embodiment of the invention in an arrangement for directly converting heat energy into electrical energy using a thermoelectric generator module 5, for example in a spacecraft operating in space on a space mission. The spacecraft may be a manned or unmanned spacecraft of any type, a rocket, a shuttle, an orbital satellite, a space station, or any other type of flying body operating in space.

As represented in the drawing FIGURE, a heat source 1 emits heat as thermal radiation 3 into an interior vacuum 2 within the interior of a chamber 7 bounded by a chamber wall 4 that is at least partially embodied as a thermally conducting body that may function as a cooling body to receive and reject heat from the heat source 1. The heat source 1 may be any generator or emitter of heat that is present in the spacecraft, for example. This heat source may be used for other purposes, whereby the heat emitted by it is regarded as waste heat that would otherwise simply be rejected to the surrounding vacuum 6 of space surrounding the outside of the chamber 7 and the spacecraft. Alternatively, the heat source 1 can be purposely operated to produce heat for generating electrical energy as follows.

In this regard, at least one thermoelectric generator module 5 is mounted or arranged in the chamber 7, e.g. on the bounding wall 4 of the chamber 7 at such a location relative to the heat source 1, so that the at least one thermoelectric generator module 5 receives the thermal radiation 3 emitted by the heat source 1 through the interior vacuum 2 within the interior of the chamber 7. Upon receiving the heat energy from the thermal radiation 3, the at least one thermoelectric generator module 5 converts (at least a portion of) the received heat to electrical energy. Also, the at least one thermoelectric generator module 5 further transfers (a portion of) the received heat by thermal conduction to the thermally conducting body 4, e.g. in the present illustrated example embodiment to the bounding wall 4 of the chamber 7 that is at least partially embodied as a thermally conducting cooling body. Alternatively, or additionally, the rejected or waste heat portion is given off from the at least one thermoelectric generator module 5 directly by thermal radiation to the surrounding vacuum 6 of space.

Namely, as schematically represented in the drawing FIGURE, the waste heat portion of the heat received by the thermoelectric generator module 5 can be thermally conducted via thermal conduction 11 into the thermally conducting body 4 represented by the wall of the chamber 7. From there, heat is removed or rejected by thermal radiation 9 from the thermally conducting chamber wall 4 to the surrounding vacuum 6 of space. Alternatively or additionally, heat may be removed or rejected from the thermoelectric generator module 5 by heat radiation 10 away from the thermoelectric generator module 5 directly to the surrounding vacuum 6 of space. Ultimately, the removal or rejection of waste heat (i.e. the heat portion that is not converted to electricity) from the thermoelectric generator module 5 to the surrounding vacuum 6 of space produces the required temperature gradient or differential across the thermoelectric generator module 5, such that the thermoelectric generator module 5 produces electrical energy in a generally known manner. Thus, the "hot side" of the thermoelectric generator receives heat via thermal radiation 3 from the heat source 1 through the interior vacuum 2 within the interior of the chamber 7, while the "cool side" of the thermoelectric generator module 5 is cooled by thermal conduction 11 into and through the thermally conducting chamber wall 4, and/or by thermal radiation 10 directly to the vacuum 6 of space. Note that some heat may also be radiated by thermal radiation 8 from the heat source 1 directly to the surrounding vacuum 6 of space, and some heat may be radiated from the heat source to areas of the chamber wall 4 not provided with thermoelectric generator modules.

While the drawing FIGURE shows only a single thermoelectric generator module 5 as a representative example, according to the invention a plurality of such thermoelectric generator modules 5 can be arranged on any portion(s) of, or the entirety of, the inner wall surface of the chamber wall 4 of the chamber 7. The interior of the chamber 7 is "filled" with a vacuum, for which the chamber 4 may be entirely enclosed, sealed and evacuated, or the chamber may be selectively vented or partially open to the vacuum 6 of space in order to achieve the evacuated vacuum within the interior of the chamber. Because the thermoelectric generator module 5 preferably receives heat from the heat source 1 only via the thermal radiation 3 through the interior vacuum 2 of the chamber 7, therefore the heat source 1 can operate at a very high temperature (e.g. 3400° C.), well above the maximum permissible temperature of the thermoelectric generator module 5. The temperature of the module 5 can be designed, determined or controlled by the distance and/or the relative orientation between the module 5 and the heat source 1 in the interior of the chamber 7.

Although the invention has been described with reference to specific example embodiments, it will be appreciated that it is intended to cover all modifications and equivalents within the scope of the appended claims. It should also be understood that the present disclosure includes all possible combinations of any individual features recited in any of the appended claims. The abstract of the disclosure does not define or limit the claimed invention, but rather merely abstracts certain features disclosed in the application.

What is claimed is:

1. An arrangement for converting heat to electrical energy, said arrangement being located in a surrounding vacuum of space, and said arrangement comprising:
a chamber comprising a chamber wall that bounds therein an evacuated interior containing an interior vacuum, wherein at least a portion of said chamber wall comprises a thermally conductive cooling body;
a heat source that emits heat via first thermal radiation and that is arranged with respect to said chamber so that said heat source is exposed to said interior vacuum and said first thermal radiation radiates directly from said heat source into and through said interior vacuum in said chamber; and
at least one thermoelectric generator module that is arranged in said chamber and exposed to said interior vacuum so as to capture said heat by directly receiving said first thermal radiation from said heat source through said interior vacuum in said chamber, wherein said at least one thermoelectric generator module converts a first portion of said captured heat to electrical energy, and wherein said at least one thermoelectric generator module is arranged so that a second portion of said captured heat is removed or rejected from said at least one thermoelectric generator module by thermal conduction to said cooling body and/or by second thermal radiation into said surrounding vacuum of space.

2. The arrangement according to claim 1, wherein said at least one thermoelectric generator module comprises a plurality of thermoelectric generator modules.

3. The arrangement according to claim 1, wherein said at least one thermoelectric generator module is mounted on said thermally conductive cooling body of said chamber wall bounding said interior.

4. The arrangement according to claim 1, wherein there is no conductive thermal coupling and no convective thermal coupling between said heat source and said at least one thermoelectric generator module.

5. The arrangement according to claim 1, wherein said first thermal radiation through said interior vacuum establishes a radiative thermal coupling which is the only thermal coupling between said heat source and said at least one thermoelectric generator module.

6. The arrangement according to claim 1, wherein there is no direct contact between said heat source and said at least one thermoelectric generator module.

7. The arrangement according to claim 1, wherein said at least one thermoelectric generator module is conductively thermally coupled to said cooling body so as to conductively reject or remove said second portion of said captured heat from said at least one thermoelectric generator module to said cooling body.

8. The arrangement according to claim 1, wherein said at least one thermoelectric generator module is directly radiatively thermally coupled to said surrounding vacuum of space outside of said chamber so as to radiatively reject or remove said second portion of said captured heat from said at least one thermoelectric generator module directly to said surrounding vacuum of space.

9. The arrangement according to claim 1, incorporated in a spacecraft that is configured and adapted to operate in space surrounded by said surrounding vacuum of space.

10. The arrangement according to claim 9, wherein said at least one thermoelectric generator module is conductively thermally coupled to said cooling body.

11. The arrangement according to claim 10, wherein said cooling body is radiatively thermally coupled to said surrounding vacuum of space.

12. The arrangement according to claim 9, wherein said at least one thermoelectric generator module is directly radiatively thermally coupled to said surrounding vacuum of space.

13. A method of converting heat to electrical energy in a surrounding vacuum of space, comprising steps:
a) evacuating a chamber to provide an interior vacuum in an interior of said chamber, wherein at least a portion of said chamber comprises a thermally conductive cooling body;
b) producing heat with a heat source and emitting said heat directly from said heat source via first thermal radiation directly into and through said interior vacuum;
c) receiving said directly first thermal radiation from said heat source through said interior vacuum to capture said heat with a thermoelectric generator module;
d) converting a first portion of said captured heat to electrical energy with said thermoelectric generator module; and
e) rejecting or removing a second portion of said captured heat from said thermoelectric generator module by second thermal radiation to said surrounding vacuum of space and/or by thermal conduction to said cooling body.

14. The method according to claim 13, wherein said method is performed in a spacecraft operating in space in said surrounding vacuum of space.

15. The method according to claim 14, wherein said step e) comprises rejecting or removing said second portion of said captured heat from said thermoelectric generator module by said second thermal radiation directly to said surrounding vacuum of space.

16. The method according to claim 14, wherein said step e) comprises rejecting or removing said second portion of said captured heat from said thermoelectric generator module to said cooling body by said thermal conduction, and further comprising cooling said cooling body by third thermal radiation from said cooling body to said surrounding vacuum of space.

17. The method according to claim 13, wherein said heat source comprises a combustion flame that is emitted directly into said interior vacuum in said chamber, and said heat is emitted directly from said combustion flame directly via said first thermal radiation into and through said interior vacuum to said thermoelectric generator module.

* * * * *